United States Patent

Nakamura et al.

[11] Patent Number: 6,057,233
[45] Date of Patent: May 2, 2000

[54] PROCESS FOR PRODUCING THIN FILM

[75] Inventors: Naoki Nakamura, Mishima; Hiroshi Hasegawa, Shizuoka; Mitsugu Hanabusa, 10-2-603 Nishi-howa, Yayoi-cho, Toyohashi-shi, Aichi, all of Japan

[73] Assignees: Toyota Jidosha Kabushiki Kaisha; Mitsugu Hanabusa, both of Aichi, Japan

[21] Appl. No.: 08/782,254

[22] Filed: Jan. 14, 1997

[30] Foreign Application Priority Data

Jan. 22, 1996 [JP] Japan .................................. 8-008619

[51] Int. Cl.⁷ .................................................. H01L 21/44
[52] U.S. Cl. ........................ 438/659; 438/662; 438/795; 438/798; 438/478; 427/553; 427/565; 427/596
[58] Field of Search .............................. 427/62, 63, 553, 427/565, 596; 438/478, 659, 662, 795, 798

[56] References Cited

U.S. PATENT DOCUMENTS

| | | | |
|---|---|---|---|
| 5,406,906 | 4/1995 | Rimai et al. ........................... | 117/92 |
| 5,490,912 | 2/1996 | Warner et al. ....................... | 204/298.02 |
| 5,650,377 | 7/1997 | Kern et al. ............................. | 505/330 |
| 5,689,428 | 11/1997 | Sauerbrey et al. .................... | 364/480 |
| 5,731,046 | 3/1998 | Mistry et al. .......................... | 427/553 |

FOREIGN PATENT DOCUMENTS 4-362171  12/1992  Japan .
5-279848  10/1993  Japan .

*Primary Examiner*—David Nelms
*Assistant Examiner*—Reneé R. Berry
*Attorney, Agent, or Firm*—Finnegan, Henderson, Farabow, Garrett & Dunner, L.L.P.

[57] ABSTRACT

To produce a high quality thin film by effectively removing the particles from the emitted substance and the oxygen retained under a high vacuum during the production of the thin film by laser ablation, there is provided a process for producing a thin film on a substrate by laser ablation in a vacuum chamber in which a laser beam is irradiated to a target to cause emission of a substance from the target and allowing the emitted substance to deposit on the substrate to grow a thin film on the substrate by laser ablation, the process including irradiating an ion beam to at least one of the substrate and a plume of the emitted substance formed between the substrate and the target.

5 Claims, 6 Drawing Sheets

PROCESS FOR PRODUCING THIN FILM

BACKGROUND OF THE INVENTION

1. Field of the Invention

The present invention relates to a process for producing a thin film, on a substrate, by laser ablation.

2. Description of the Related Art

A process for producing a thin film on a substrate in a vacuum chamber by laser ablation is known, the process including irradiating a laser beam onto a target to cause emission of a substance from the target and allowing the emitted substance to deposit on the substrate to produce a thin film on the substrate.

The laser ablation is advantageous with respect to other methods of producing a thin film in the following points: (1) it provides a high purity thin film only containing impurities in a very small amount because the thin film is solely made of atoms, molecules and ions emitted from the target in a vacuum chamber, (2) an optimum condition for producing a thin film with a desired thickness can be freely selected because many parameters including pressure, substrate temperature, and film growth speed can be separately selected during the film production, and (3) the film growth speed is high and the film production process is very simple to reduce the production cost.

In particular, a process for producing a silicon thin film having good quality by laser ablation is thought to be one of the most promising processes to commercially provide inexpensive high efficiency thin film solar cells, thin film transistors (TFTs) and other electronic and optical devices. The process is being also studied to provide a production process for diamond-like carbon (DLC) thin films, high temperature superconducting thin films, and dielectric thin films.

Laser ablation, however, has a problem in that the emitted substance from a target is not completely dissociated but includes undissociated particles, or clusters, other than dissociated atoms, molecules, or ions and the particles are undesirably introduced into the product thin film. For example, such particles, when present in a silicon thin film for electronic or optical devices, are detrimental to the device performance, and also, oxygen present in the thin film has an adverse effect on the basic properties of a semiconductor such as the electric properties (resistivity, etc.) and the optical properties (light absorption, etc.).

Japanese Unexamined Patent Publication No. 5-279848 proposed to reduce inclusion of the particles by irradiating a laser beam other than that for ablation to the emitted substance from a target to facilitate dissociation of clusters.

The proposal, however, has the drawback that equipment and operating costs are unavoidably raised because a high power laser beam is required to force the clusters to be dissociated. Moreover, it is not practically possible to entirely dissociate the clusters included in the whole volume of the emitted substance. The proposed way is also substantially ineffective in reducing the retained oxygen.

SUMMARY OF THE INVENTION

It is the object of the present invention to provide a process for producing a high quality thin film by effectively removing the particles from the emitted substance and the oxygen retained under a high vacuum during the production of the thin film by laser ablation.

To achieve the object according to the present invention, there is provided a process of producing a thin film on a substrate by laser ablation in a vacuum chamber, comprising irradiating a laser beam onto a target to cause emission of a substance from the target and allowing the emitted substance to deposit on the substrate to grow a thin film on the substrate, the process further comprising irradiating an ion beam to the substrate, or to the plume of the emitted substance formed between the substrate and the target, or both to the substrate and the plume, during the growth of the thin film.

According to the present invention, at least one of the substrate and the plume of emitted substance is irradiated by an ion beam, and the ion beam energy suppresses both formation of particles during emission from the target and clustering of the emitted vapor, and also decomposes any particles once formed. The ion beam has a very great mass with respect to the laser beam, which is light, and it is very easy to provide high energy. It is also advantageous in that formation of an ion atmosphere sharply reduces introduction of oxygen into a thin film being grown. The ion beam irradiation also has an additional effect that it generally facilitates formation of a dense, high quality thin film.

The film growth speed may be undesirably reduced by irradiation of an ion beam to the plume of the emitted substance, because part of the film-forming material in the form of atoms, molecules, or ions is moved out from the plume by the high energy ion beam and cannot reach the substrate. Such reduction in the film growth speed is prevented by irradiation of a plurality of ion beams to surround the plume of the emitted substance to confine the film-forming material within the plume.

DESCRIPTION OF THE PREFERRED EMBODIMENTS

The preferred embodiments of the present invention will be described in detail with reference to the attached drawings.

EXAMPLE 1

Figure 1:
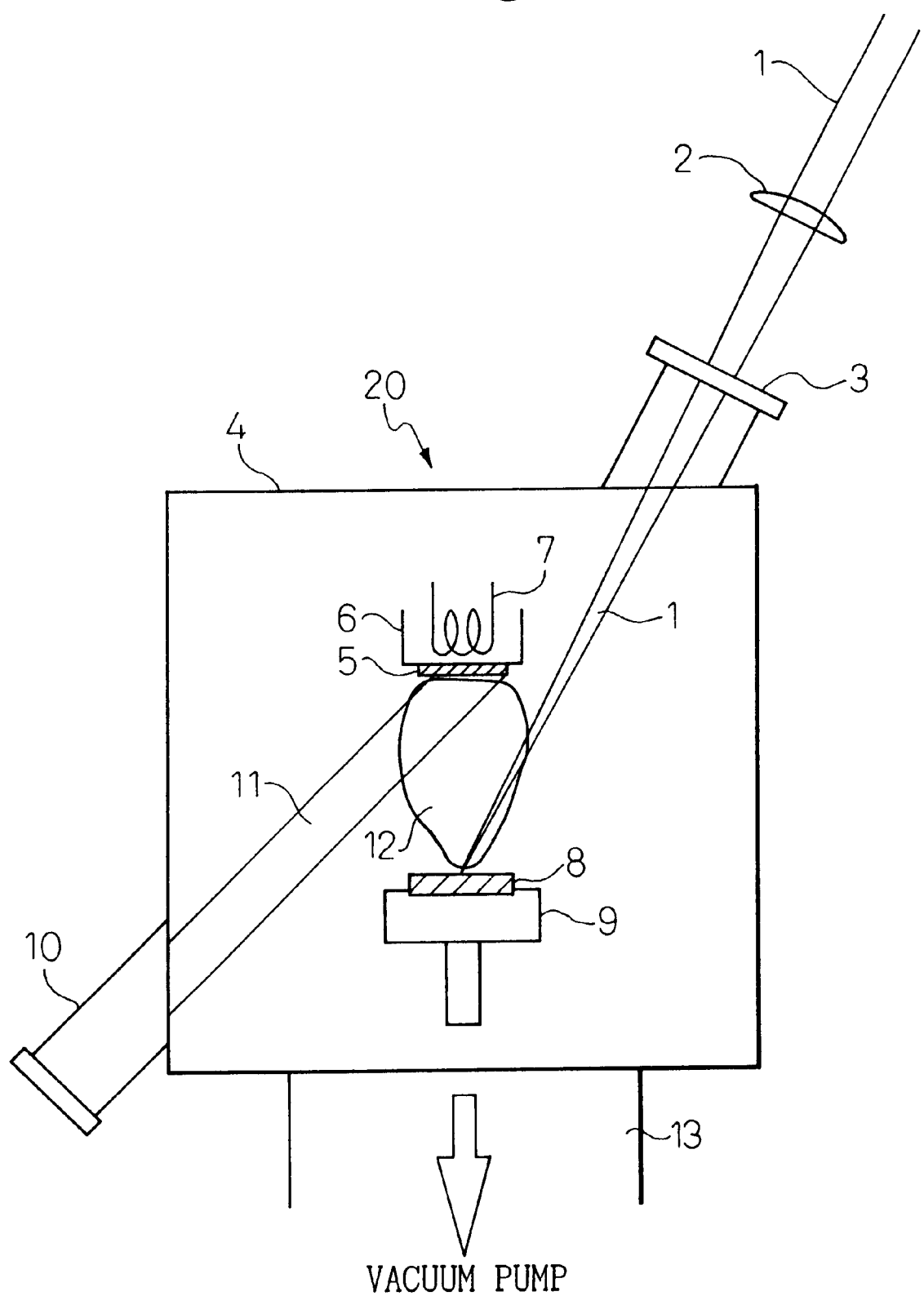
FIG. 1 shows an arrangement for producing a thin film on a substrate by laser ablation in which an ion beam is irradiated to the substrate according to the present invention, in a cross-sectional view.

A laser ablation film-growing apparatus 20, as shown in FIG. 1, was used to produce a silicon thin film. The apparatus 20 had a vacuum chamber 4 enclosing a substrate holder 6 on which a substrate 5 was mounted and a target holder 9 on which a target 8 was mounted. The substrate 5 was held at a predetermined temperature by a heater 7 provided in the substrate holder 6. Two types of substrates 5 were used; one was a silicon wafer for semiconductor device fabrication and the other was a synthetic silica board. The vacuum chamber 4 was evacuated by a vacuum pump through an evacuation port 13 open to the bottom of the chamber 4.

A pulsed laser beam 1 was introduced into the vacuum chamber 4 through a lens system 2 and a laser beam inlet port 3 from a laser generator (not shown) provided outside the chamber 4. The laser beam irradiation caused the substance of the target 8 to be emitted to form a plume 12, which was observed as a flame between the substrate 5 and the target 8.

Two types of laser beams 1 were used; one was an ArF excimer laser beam having a wavelength of 193 nm and the other was a KrF excimer laser having a wavelength of 248 nm. The irradiation energy was 15 to 80 mJ/pulse.

In this example, the surface of the substrate 5 was irradiated by an ion beam 11 from an ion source 10 disposed in the side wall of the vacuum chamber 4. The ion beam irradiation onto the substrate 5 not only prevents inclusion of particles and oxygen in the product silicon thin film, but also has a subsidiary effect in that the direct ion beam irradiation onto the substrate provides a strong Si—Si bond, a high density, and an improved opto-electronic property of the produced silicon thin film. An ion beam having too small an energy neither prevents inclusion of particles and oxygen nor provides the subsidiary effect. However, an ion beam having too large an energy does not provide a good thin film because the substrate 5 is damaged by sputter-etching or by ion implantation. Therefore, the ion beam must have an energy sufficient to prevent inclusion of particles and oxygen in the product thin film and must be controlled to within a range in which sputter-etching or ion implantation does not occur.

Figure 2:
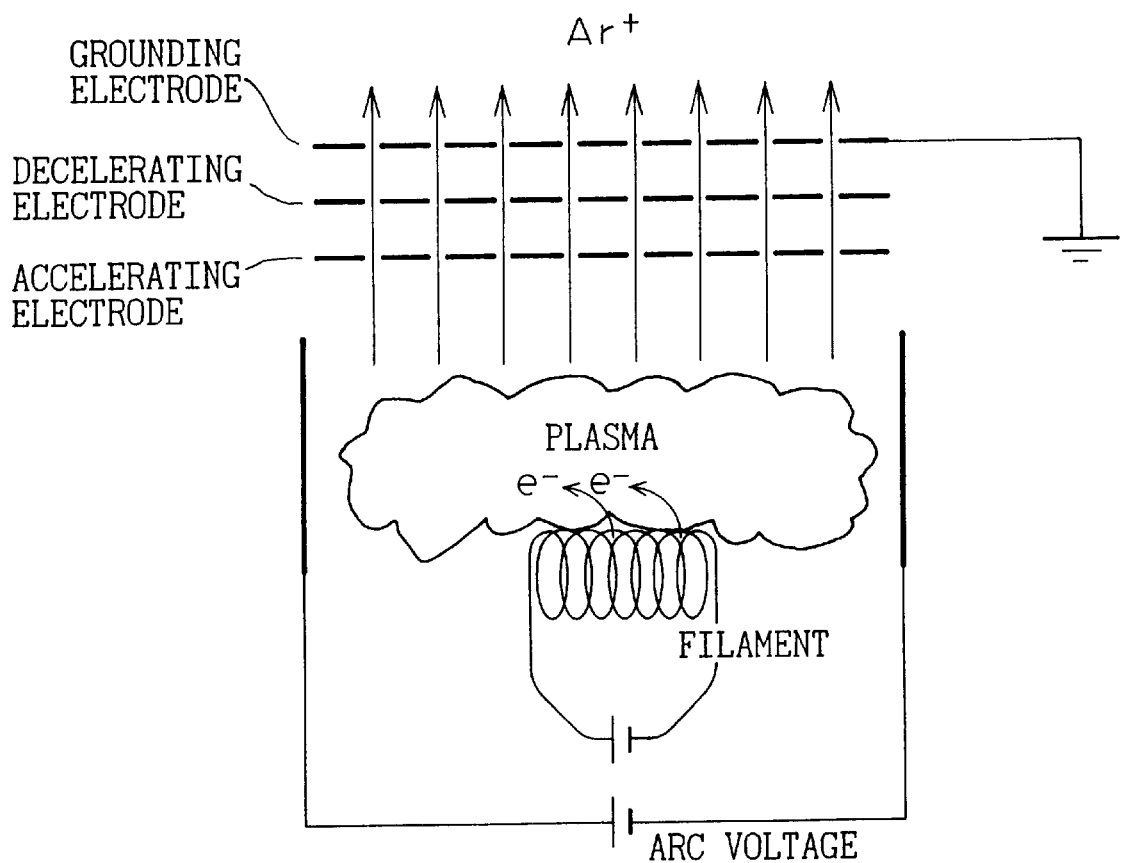
FIG. 2 schematically illustrates a basic construction of an ion source suitably applicable in the ion beam irradiation according to the present invention.

FIG. 2 shows a basic construction of the ion source 10 in which a filament emits thermal electrons which ionize a supplied gas, or Ar gas in this example, to form a plasma. The arc voltage for generating the plasma was 80 V. The thus-produced $Ar^+$ ions are accelerated by the electric potential difference between an accelerating electrode and a decelerating electrode and the electric potential difference between the decelerating and a grounding electrode (0 V). In this three-electrode construction, $Ar^+$ ions are decelerated after passing the decelerating electrode. The accelerating electrode and the decelerating electrode can be separately fed an accelerating current and a decelerating current. The total number of ions and the energy of individual ions can be separately controlled by controlling the filament current and the electrode potentials.

In this example, the vacuum chamber 4 was evacuated to a vacuum of $5 \times 10^{-7}$ Torr and an Ar gas for generating an ion beam was then supplied to the ion source 10. The Ar gas supply was controlled to maintain a vacuum of $1 \times 10^{-5}$ Torr within the chamber 4.

The irradiation of the ion beam 11 onto the substrate 5 was initiated and terminated synchronously with initiation and termination of the irradiation of laser beam 1 to the target 8. Namely, the ion beam irradiation was initiated at the same time as the initiation of the laser beam irradiation, or the initiation of the thin film growth, and was terminated at the same time as the termination of the laser beam irradiation, or the termination of the thin film growth.

An experiment was conducted with different filament currents and electrode potentials of the ion source 10 and showed that prevention of inclusion of particles and oxygen was facilitated as the total number of ions was increased by increasing the filament current and the energy of individual ions was increased by increasing the acceleration potential. This is considered because the ion beam energy is determined as a sum of the energy of individual ions and the dissociation of particles and the suppression of formation of particles are facilitated as the ion beam energy is increased.

The thus-produced silicon thin film had physical properties in which the influence of the ion beam parameters were observed. For example, for the thin film solar cell application, a silicon thin film having good physical properties including a low resistivity and a wide light absorption range was produced when the Ar ion beam energy was 400 to 1100 eV and the I/A ratio (the ratio of the number of the irradiated ions to the number of the deposited silicon atoms) was 0.2 to 1.1.

Although the laser beam irradiation term arid the ion beam irradiation term were completely synchronized in this example, the irradiation timing may not be limited in this manner. For example, it is possible that the ion beam irradiation is first initiated at a low energy level which is only effective for cleaning a substrate, and the laser beam irradiation is then initiated to grow a thin film at the same time as the energy level of the ion beam irradiation is raised to a higher level which is effective to prevent inclusion of particles and oxygen, and when the thin film has grown to a desired thickness, the laser beam irradiation is terminated to terminate the film growth at the same time as the ion beam energy level is reduced to the initial lower level.

Comparative Example

For comparison, a silicon thin film was produced under the same condition as used in Example 1, except that the ion beam irradiation was not used.

Figure 3:
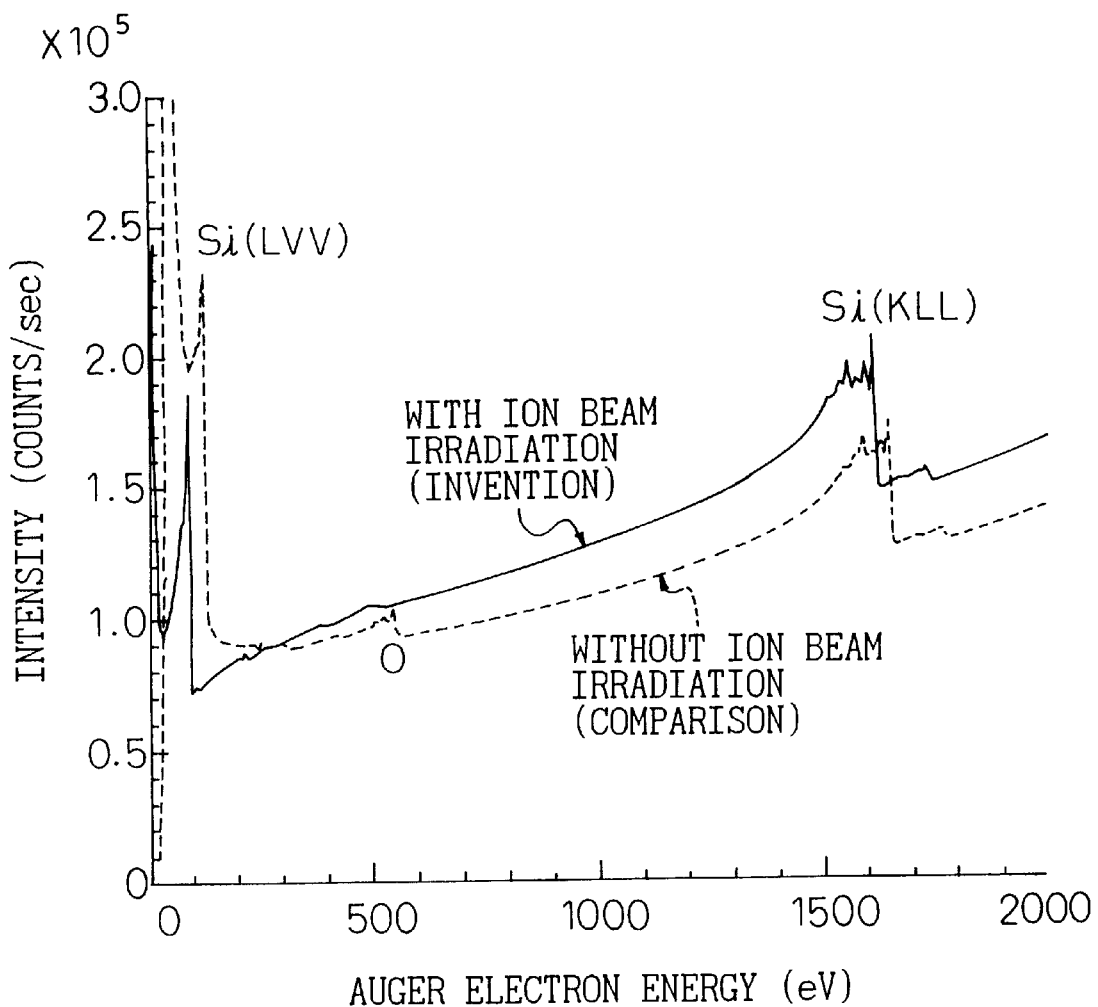
FIG. 3 is a graph showing wide scan spectre by Auger electron energy spectroscopy of a silicon thin film formed on a substrate produced by laser ablatior with ion beam irradiation onto the substrate according to the present invention and of a conventional silicon thin film formed without ion beam irradiation, respectively.

The silicon thin films produced in Example 1 and Comparative Example were analyzed by Auger electron spectroscopy to determine the oxygen contents thereof. FIG. 3 shows the results in the form of an Aucler electron wide scan spectrum.

Referring to FIG. 3, in the silicon thin film of the Comparative Example produced without the ion beam irradiation, the Auger electron energy had an obvious intensity peak of oxygen (O), other than the intensity peaks of silicon (SiLLV, SiKLL), to show inclusion of oxygen in the product silicon thin film. The oxygen content of this comparative sample was estimated 9.9 wt % by a calculation based on the differentiated spectrum of the Auger electron spectrum and considering the relative sensitivity factors of the respective elements.

In contrast, in the silicon thin film of Example 1 produced with the ion beam irradiation, only the intensity peaks of silicon are observed and no peaks of oxygen was observed to show absence of oxygen in the product silicon thin film.

EXAMPLE 2

Figure 4:
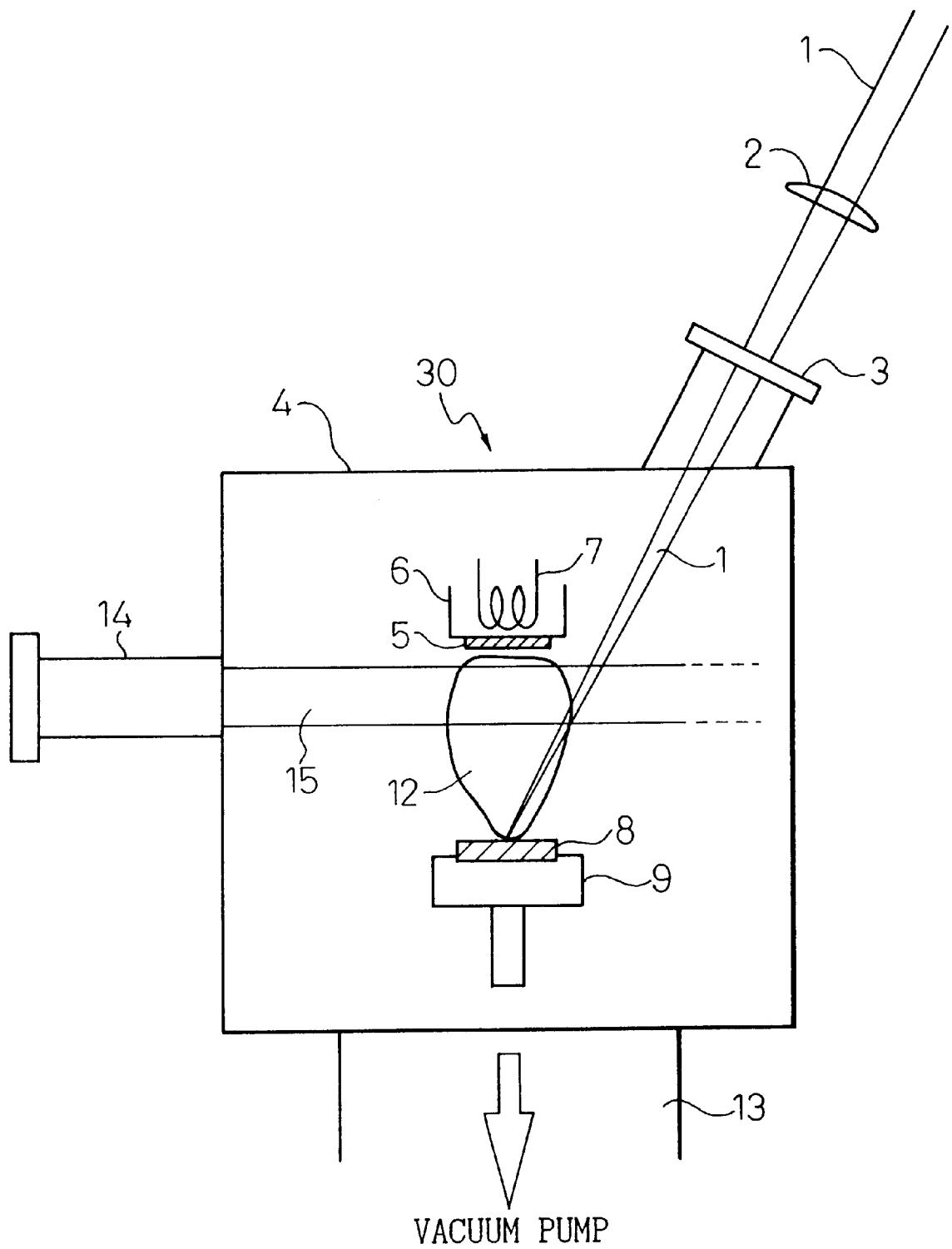
FIG. 4 shows an arrangement for producing a thin film on a substrate by laser ablation in which a single ion beam is irradiated to a plume of emitted substance according to the present invention, in a cross-sectional view.

FIG. 4 shows a laser ablation film-growing apparatus according to another embodiment of the present invention. The film-growing apparatus 30 has basically the same structure as the apparatus 20 of Example 1 shown in FIG. 1, except that an ion beam from an ion source 14 disposed in the side wall of the vacuum chamber 4 is not directed to the substrate 5 but is directed to a plume 12 of emitted substance.

The ion beam is advantageous in that it imparts its high energy to deposited atoms on a substrate to facilitate migration of the deposited atoms over the substrate, that it imparts its momentum to the deposited atom layer and increase the density of the deposited atom layer, and in that it enables a thin film to grow by a thermal non-equilibrium process and allows a film growth at room temperature.

In this example, the ion beam 15 is not irradiated to the substrate but is irradiated to the plume 12 of emitted substance alone. Therefore, the ion beam energy need not be limited to avoid sputter-etching or ion implantation of the substrate 5 as encountered in Example 1, so that an increased ion beam energy can be used to most effectively prevent inclusion of particles and oxygen and also to maximize the above-mentioned advantage of the ion beam. For example, particles are removed by sputtering when the ion beam energy is more than several hundreds eV, but when the ion beam energy is 10 keV to several hundreds keV, the electron impingement is more significant than the atom impingement with solid atoms to reduce the sputtering rate. Moreover, when the ion beam energy is more than several hundreds keV, solid atoms are intensely excited and ionized and the dissociation of particles is thereby facilitated.

EXAMPLE 3

Figure 5:
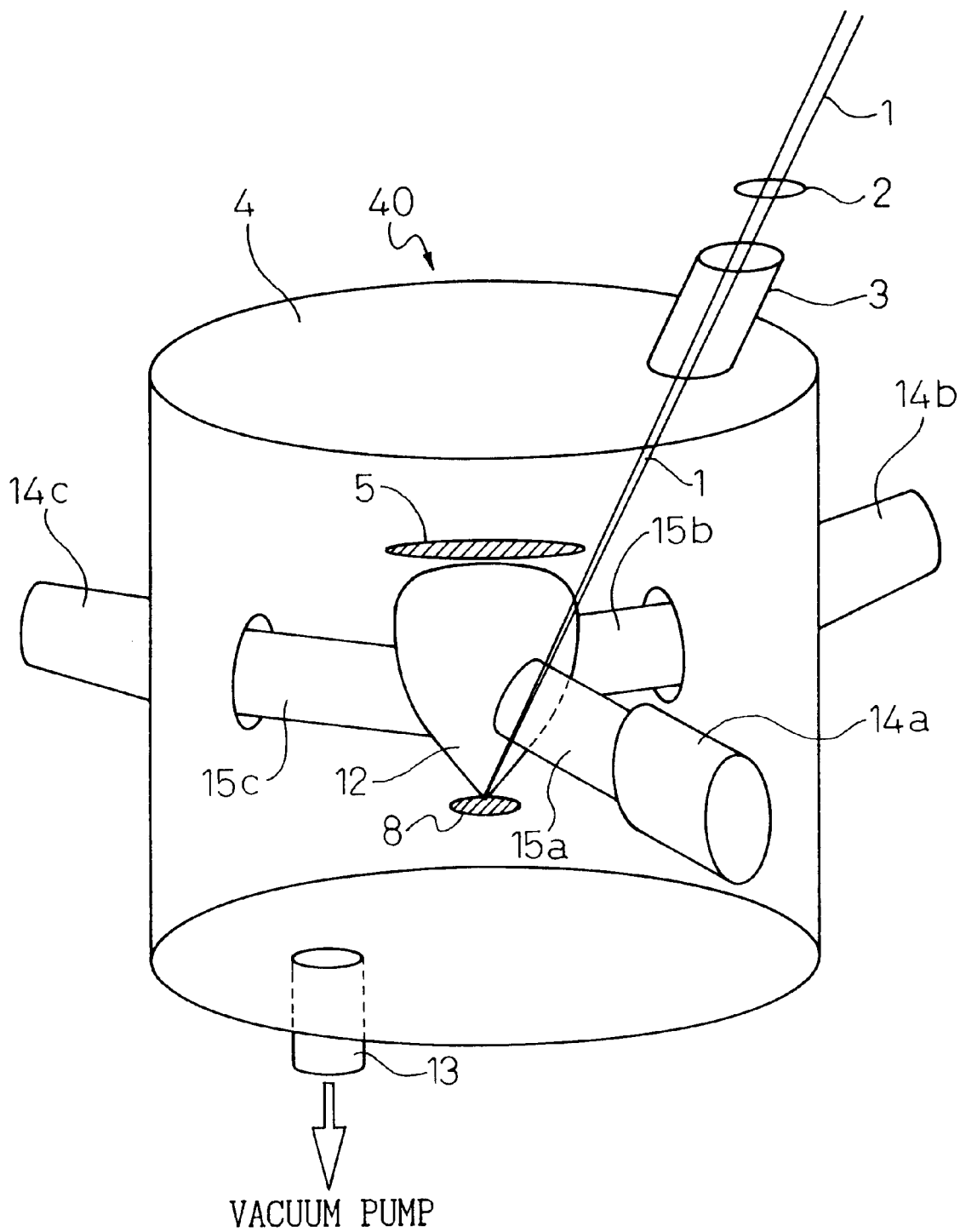
FIG. 5 shows an arrangement for producing a thin film on a substrate by laser ablation in which three ion beams are irradiated to a plume of emitted substance to surround the plume according to the present invention, in a perspective view.

FIG. 5 shows a laser ablation film-growing apparatus according to a further embodiment of the present invention. The film-growing apparatus 40 has basically the same structure as the apparatus 30 of Example 2 shown in FIG. 4, except that ion beams are irradiated onto the plume 12 by three ion sources 14a, 14b, 14c which are disposed in the side wall of the vacuum chamber 4. The ion sources 14a, 14b, 14c are disposed at an angle of 120° between each other and respectively irradiate ion beams 15a, 15b, 15c onto the plume 12.

In Example 2, the film growth speed may undesirably be reduced by irradiation of a single ion beam 15 from a single ion source 14 to the plume 12 of the emitted substance, because part of the film-forming material or silicon atoms is moved out from the plume 12 by the high energy ion beam and cannot reach the substrate 5.

In this example, such a reduction in the film growth speed is prevented and a high growth speed is ensured by irradiation of three ion beams in three directions to surround the plume 12 of the emitted substance to prevent silicon atoms from being moved out of the plume 12. Moreover, the plume 12 is confined by the three ion beams to produce a high energy plasma, which strongly promotes prevention of the particle formation and dissociation of particles and further promotes prevention of inclusion of particles into the product thin film.

EXAMPLE 4

Figure 6:
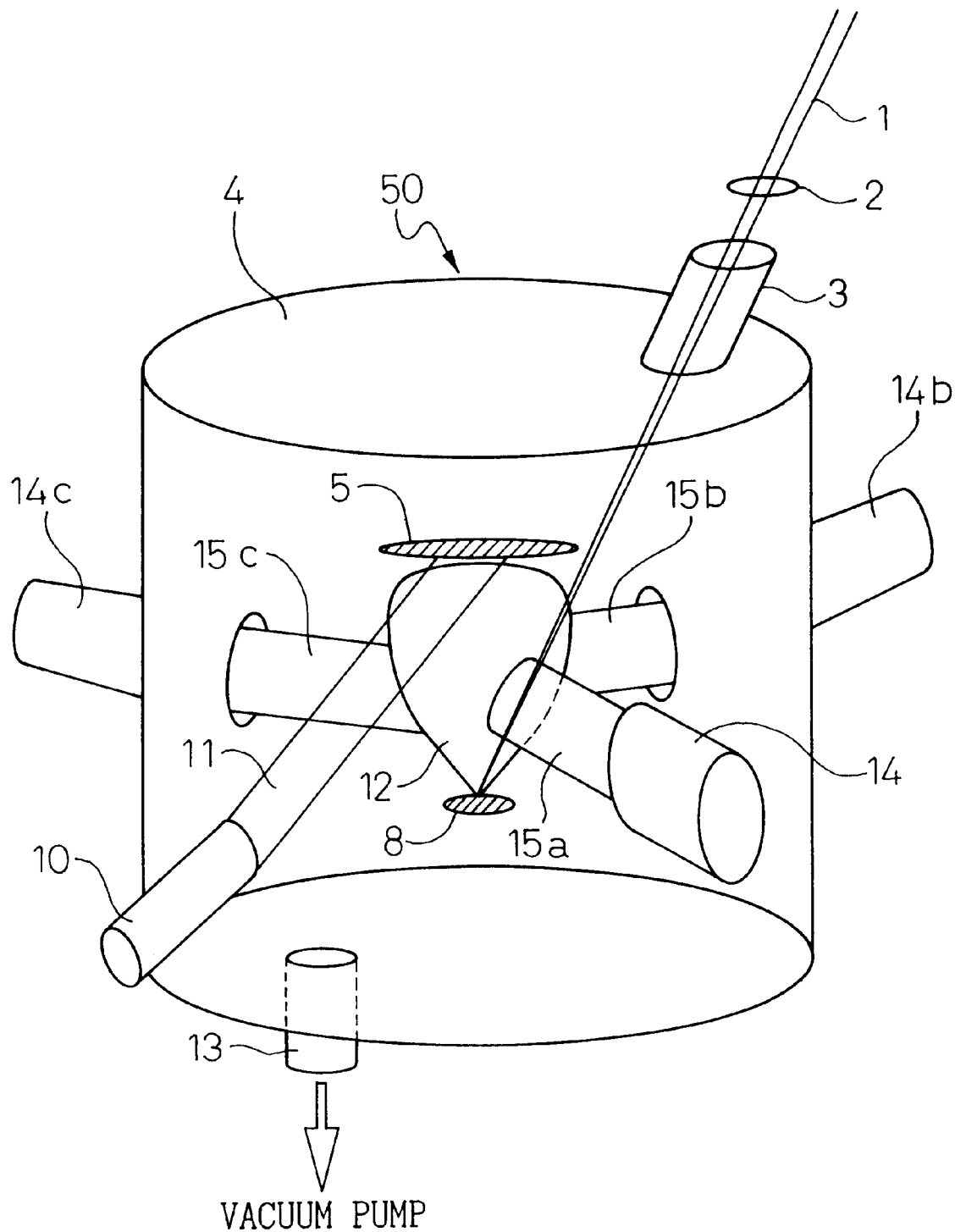
FIG. 6 shows an arrangement for producing a thin film on a substrate by laser ablation in which an ion beam is irradiated to the substrate while three ion beams are irradiated to a plume of emitted substance to surround the plume according to the present invention, in a perspective view.

FIG. 6 shows a laser ablation film-growing apparatus according to a still further embodiment of the present invention. The film-growing apparatus 50 has a structure in which the apparatus 40 of Example 3 shown in FIG. 5 further includes the ion source 10 for irradiating the ion beam 11 onto the substrate 5 as used in the apparatus 20 of Example 1 shown in FIG. 1.

In addition to the advantageous effect of Example 3, this example also provides the subsidiary effect of Example 1, i.e., the density of the product silicon thin film is increased by a strong Si—Si bond to provide a thin film with an improved opto-electronic property.

As herein described above, the present invention provides a process for producing a high quality thin film on a substrate by laser ablation, in which an ion beam is irradiated to at least one of the substrate and a plume of emitted substance to prevent inclusion of particles and oxygen in the product thin film. The present invention also provides a subsidiary effect that the ion beam irradiation to the substrate increases the density of the produced thin film.

What is claimed is:

1. A process for producing a thin film on a substrate by laser ablation in a vacuum chamber, comprising irradiating a laser beam onto a target to cause emission of a substance from the target and allowing the emitted substance to deposit on the substrate to grow a thin film on the substrate, the process further comprising irradiating an ion beam onto the substrate during the growth of the thin film, wherein said ion beam, which does not contain ions emitted from the target, has an energy sufficient to prevent emission of particles from the target, to prevent clustering of a vapor emitted from the target, to decompose any particles once formed, and to prevent introduction of oxygen into said thin film, said energy being controlled to within a range in which sputter-etching or ion implantation of the irradiated substrate does not occur.

2. A process for producing a thin film on a substrate by laser ablation in a vacuum chamber, comprising irradiating a laser beam onto a target to cause emission of a substance from the target and allowing the emitted substance to deposit on the substrate to grow a thin film on the substrate, the process further comprising irradiating an ion beam onto a plume of the emitted substance between the substrate and the target during the growth of the thin film, wherein said ion beam, which does not contain ions emitted from the target, has an energy sufficient to prevent emission of particles from the target, to prevent clustering of a vapor emitted from the target, to decompose any particles once formed, and to prevent introduction of oxygen into said thin film, said energy being controlled to within a range in which sputter-etching or ion implantation of the irradiated substrate does not occur.

3. A process according to claim 2, wherein a plurality of ion beams are irradiated onto the plume to surround the plume.

4. A process for producing a thin film on a substrate by laser ablation in a vacuum chamber, comprising irradiating a laser beam onto a target to cause emission of a substance from the target and allowing the emitted substance to deposit on the substrate to grow a thin film on the substrate, the process further comprising irradiating an ion beam onto the substrate and to a plume of the emitted substance between the substrate and the target during the growth of the thin film, wherein said ion beam, which does not contain ions emitted from the target, has an energy sufficient to prevent emission of particles from the target, to prevent clustering of a vapor emitted from the target, to decompose any particles once formed, and to prevent introduction of oxygen into said thin film, said energy being controlled to within a range in which sputter-etching or ion implantation of the irradiated substrate does not occur.

5. A process according to claim 4, wherein a plurality of ion beams are irradiated to the plume to surround the plume.

* * * * *